(12) United States Patent
Pellizzer et al.

(10) Patent No.: US 7,687,830 B2
(45) Date of Patent: Mar. 30, 2010

(54) PHASE CHANGE MEMORY WITH OVONIC THRESHOLD SWITCH

(75) Inventors: Fabio Pellizzer, Follina (IT); Agostino Pirovano, Farbetta (IT)

(73) Assignee: Ovonyx, Inc., Boise, ID (US)

( * ) Notice: Subject to any disclaimer, the term of this patent is extended or adjusted under 35 U.S.C. 154(b) by 1271 days.

(21) Appl. No.: 10/943,409

(22) Filed: Sep. 17, 2004

(65) Prior Publication Data

US 2006/0073652 A1     Apr. 6, 2006

(51) Int. Cl.
 *H01L 29/76* (2006.01)

(52) U.S. Cl. ............ 257/214; 257/298; 257/E29.324

(58) Field of Classification Search ............ 257/214, 257/298
See application file for complete search history.

(56) References Cited

U.S. PATENT DOCUMENTS

| | | | |
|---|---|---|---|
| 3,271,591 A | 9/1966 | Ovshinsky | 307/88.5 |
| 3,573,757 A | 4/1971 | Adams | 340/173 |
| 5,825,046 A | 10/1998 | Czubatyj et al. | 257/2 |
| 5,912,839 A | 6/1999 | Ovshinsky | 365/185.03 |
| 6,816,404 B2 | 11/2004 | Khouri et al. | 365/163 |
| 2002/0070379 A1* | 6/2002 | Dennison | 257/5 |
| 2003/0073295 A1* | 4/2003 | Xu | 438/518 |
| 2004/0112723 A1* | 6/2004 | Jung et al. | 200/61.02 |
| 2005/0051901 A1* | 3/2005 | Chen | 257/758 |
| 2005/0124155 A1* | 6/2005 | Brooks et al. | 438/654 |

FOREIGN PATENT DOCUMENTS

EP   1 326 254 A1   7/2003
GB   1 296 712      11/1972

OTHER PUBLICATIONS

Van Landingham, "Circuit Applications of Ovonic Switching Devices", IEEE Transactions on Electron Devices, vol. ED-20, No. 2, Feb. 1973.

* cited by examiner

*Primary Examiner*—Wai-Sing Louie
(74) *Attorney, Agent, or Firm*—Trop, Pruner & Hu, P.C.

(57) ABSTRACT

A phase change memory includes a memory element and a selection element. The memory element is embedded in a dielectric and includes a resistive element having at least one sublithographic dimension and a storage region in contact with the resistive element. The selection element includes a chalcogenic material embedded in a dielectric. The chalcogenic material and the storage region are part of a stack having a common etched edge.

7 Claims, 9 Drawing Sheets

PHASE CHANGE MEMORY WITH OVONIC THRESHOLD SWITCH

BACKGROUND

The present invention relates to a phase change memory.

Phase change memories use a class of materials that have the property of switching between two phases having distinct electrical characteristics, associated to two different crystallographic structures of the material, and precisely an amorphous, disordered phase and a crystalline or polycrystalline, ordered phase. The two phases are hence associated to resistivities of considerably different values.

Currently, the alloys of elements of group VI of the periodic table, such as Te or Se, referred to as chalcogenides or chalcogenic materials, can be used advantageously in phase change memory cells. The currently most promising chalcogenide is formed from an alloy of Ge, Sb and Te ($Ge_2Sb_2Te_5$).

In the chalcogenides, the resistivity may vary by two or more orders of magnitude when the material passes from the amorphous (more resistive) phase to the crystalline (more conductive) phase, and vice versa.

Phase change can be obtained by locally increasing the temperature. Below 150° C., both the phases are relatively stable, with an amorphous bit tending to gradually crystallize over a period of years if held at 150° C. Starting from an amorphous state, and raising the temperature above 200° C., where there is a rapid nucleation of the crystallites and, if the material is kept at the crystallization temperature for a sufficiently long time, it undergoes a phase change and becomes crystalline. Preferably, the material is cooled off slowly to better assure the crystalline state. To bring the chalcogenide back to the amorphous state it is necessary to raise the temperature above the melting temperature (approximately 600° C.) and then rapidly cool off the chalcogenide.

DETAILED DESCRIPTION

Figure 1:
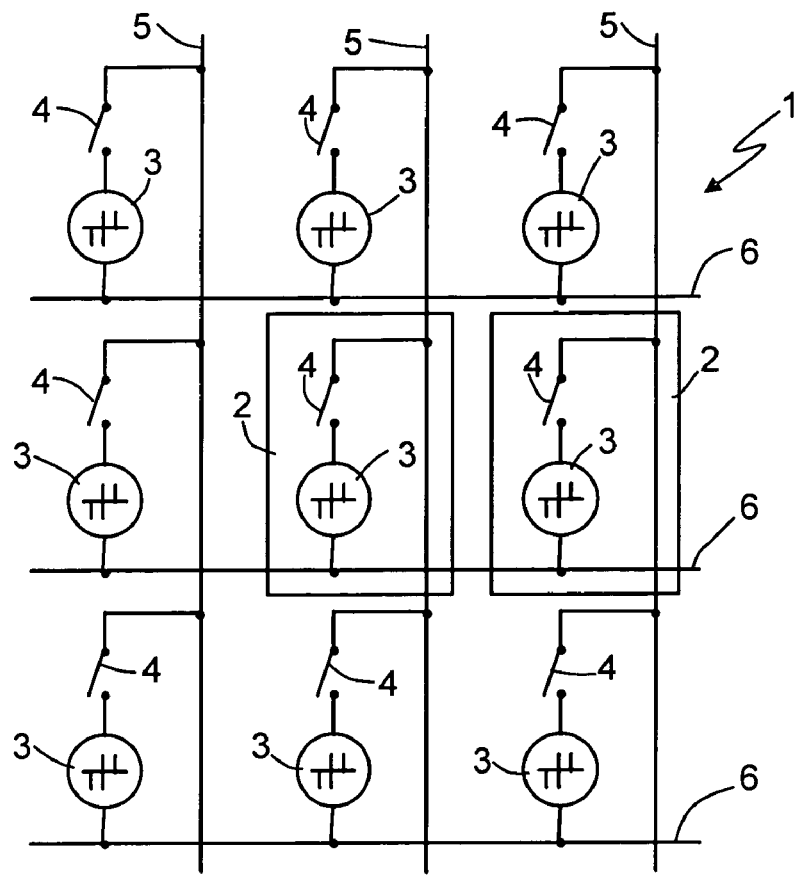
FIG. 1 is a schematic diagram of one embodiment of the present invention.

In a phase change memory including chalcogenic elements as storage elements, memory cells are arranged in rows and columns to form an array 1, as shown in FIG. 1. The memory array 1 of FIG. 1 comprises a plurality of memory cells 2, each including a phase change memory element 3 and a selection element 4. The memory cells 2 are interposed at cross-points of rows 6 (also called word lines) and columns 5 (also called bit lines).

In each memory cell 2, the memory element 3 has a first terminal connected to a word line 5 and a second terminal connected to a first terminal of a selection element 4. The selection element 4 has a second terminal connected to a bit line 6. In another solution, the memory element 3 and the selection element 4 of each cell 2 may be exchanged in position.

A binary memory may be formed by an array of cells 2 including a selection element 4 that may be called "ovonic threshold switch" (also referred to as an OTS hereinafter), connected in series with a memory element 3 that may be called "ovonic memory switch" (OMS). The OTS and the OMS may be formed adjacent to each other on an insulating substrate and may be connected to each other through a conducting strip. Each cell is coupled between a row and a column of a memory array.

The OMS may be formed by a chalcogenic semiconductor material having two distinct metastable phases (crystalline and amorphous) associated to different resistivities. The OTS may be built with a chalcogenic semiconductor material having one single phase (generally amorphous, but sometimes crystalline) with two distinct regions of operation associated to different resistivities. The OTS may have a higher resistance than the OMS. When a memory cell is to be read, a voltage drop is applied to the cell that is insufficient to trigger the OMS when the latter is in its higher resistance condition (associated with a digital "0" state). That same voltage drop may be sufficient to drive the OTS and OMS into its low resistance condition when the OMS is already in its low resistance condition (associated with a digital "1" state).

Figure 2:
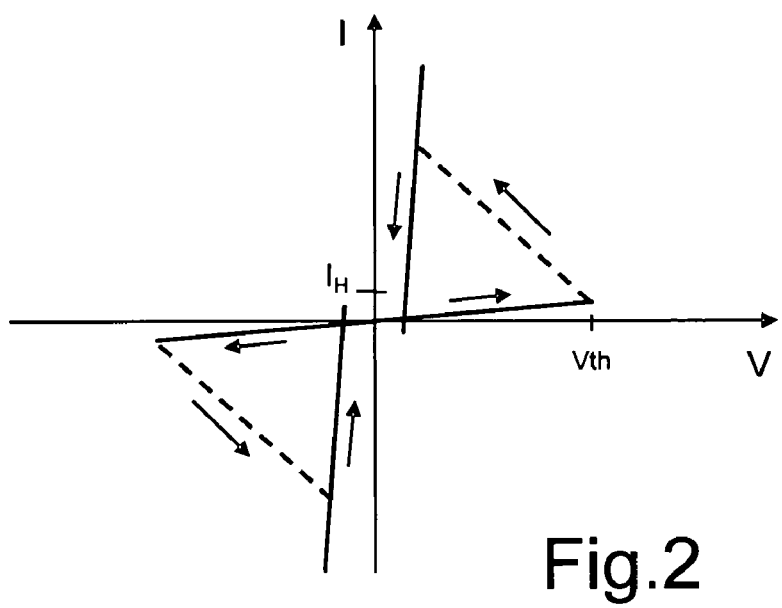
FIG. 2 is a current-voltage curve of one embodiment of the present invention.

The OTS may have the typical characteristic shown in FIG. 2. That OTS has a high resistance for voltages below a threshold value Vth. When the applied voltage exceeds the threshold value Vth, the OTS begins to conduct at a substantial constant, low voltage and presents a low impedance. When the current through the OTS falls below a holding current $I_H$, the OTS goes back to his high-impedance condition. This behavior may be symmetrical and may occur also for negative voltages and currents.

A phase change memory device comprises a chalcogenic material and a resistive electrode, also called a heater. In fact, from an electrical point of view, the crystallization temperature and the melting temperature are obtained by causing an electric current to flow through the chalcogenic material and its resistive electrode in contact or close proximity with the chalcogenic material. The chalcogenic material is heated by Joule effect in the resistive electrode and current/voltage and the Joule effect in the chalcogenic material.

In particular, a voltage/current pulse of a suitable length (corresponding to the crystallization time) and amplitude (corresponding to the crystallization temperature) crystallizes the chalcogenic material. The chalcogenic material changes state, switching to a lower resistivity in the crystalline state (also called the set state).

Vice versa, a shorter voltage/current pulse (e.g., 20 nanoseconds) of suitable amplitude (corresponding to the melting temperature) melts the chalcogenic material, cooling it down rapidly and then quenching it in the amorphous phase.

Figure 3:
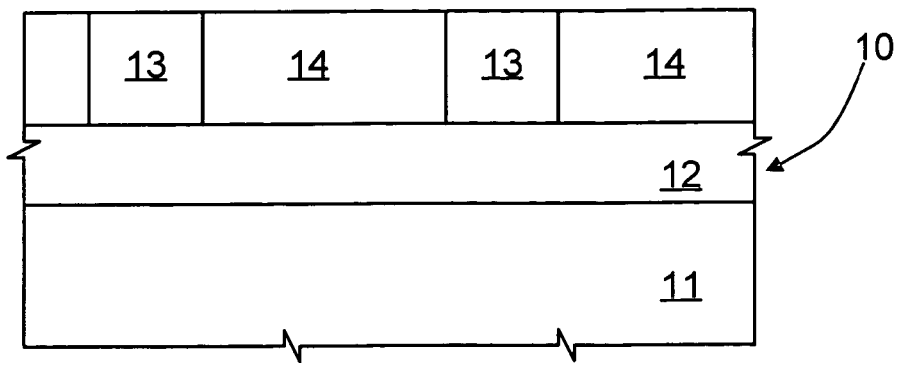
FIGS. 3-10 are cross-sections through a semiconductor device according to a first embodiment of the invention, in subsequent manufacturing steps, taken along line 10-10 of FIG. 12.
Figure 4:
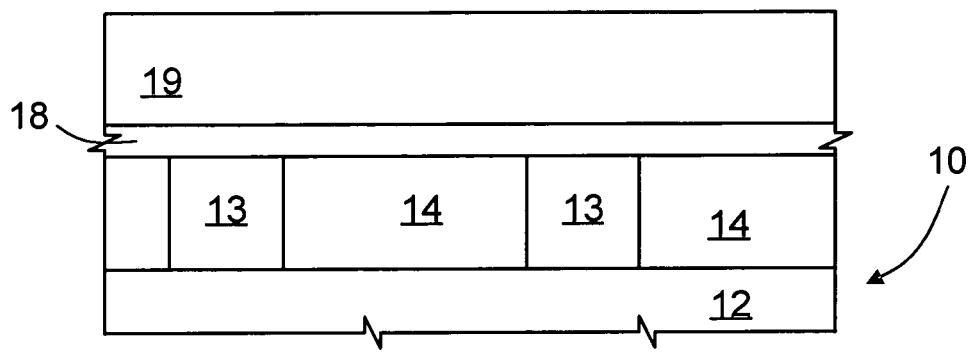

Referring to FIG. 3, a wafer 10 includes a substrate 11 of semiconductor material (e.g. silicon). The wafer 10 may include an insulating layer 12. Row lines 13 are formed on top of the insulating layer 12, insulated from each other by a first dielectric layer 14. The row lines 13 (corresponding to the word lines 6 of FIG. 1) may be formed, via a damascene process, by forming the first dielectric layer 14 and then removing the dielectric material where the row lines 13 are to be formed. The resulting trenches are filled with copper. Any excess copper is then removed from the surface of the wafer 10 by chemical mechanical polishing (CMP), as shown in FIG. 4.

Figure 5:
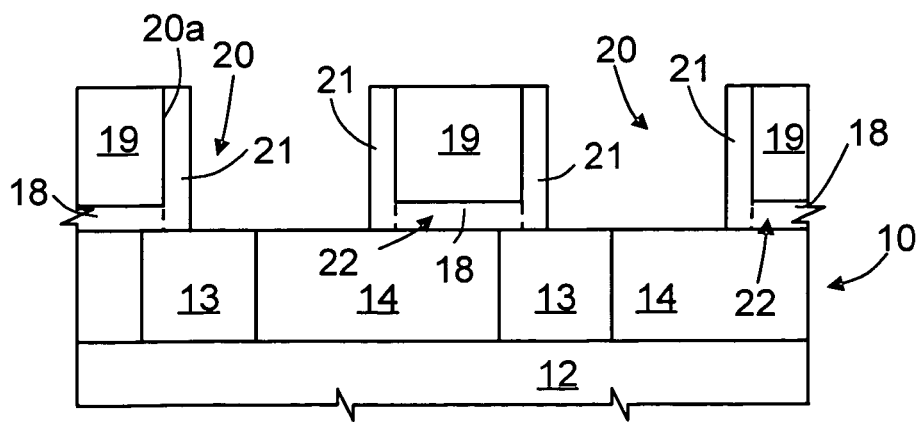

An encapsulating structure may be formed by depositing, in sequence, a first nitride layer 18 and a first oxide layer 19 (FIG. 4) and then selectively removing the first oxide layer 19 and the first nitride layer 18 down to the surface of the first dielectric layer 14 (FIG. 5). Thus, in FIG. 5, for each row line 13, an opening 20 is formed which extends at least partially on top of the row line 13. In particular, at least one vertical surface 20a of each opening 20 extends above a respective row line 13. Each opening 20 may extend along the whole respective row line 13 or along only a part thereof, in which case a plurality of openings 20 are aligned to each other along each row line 13. The openings 20 may have a substantially parallelepipedal shape.

Then, a spacer layer, e.g. of silicon nitride, is deposited and etched back. Thus, the horizontal portions of the spacer layer are removed, and only vertical portions thereof, indicated at 21 and extending along the vertical surfaces of the opening 20, are left. These vertical portions 21 join the first nitride layer 18 laterally to the openings 20 and form, with the first nitride layer 18, a protective region indicated by 22. Thus, the structure of FIG. 5 is obtained, wherein the protective region 22 together with the first oxide layer 19 form an encapsulating structure.

Figure 6:
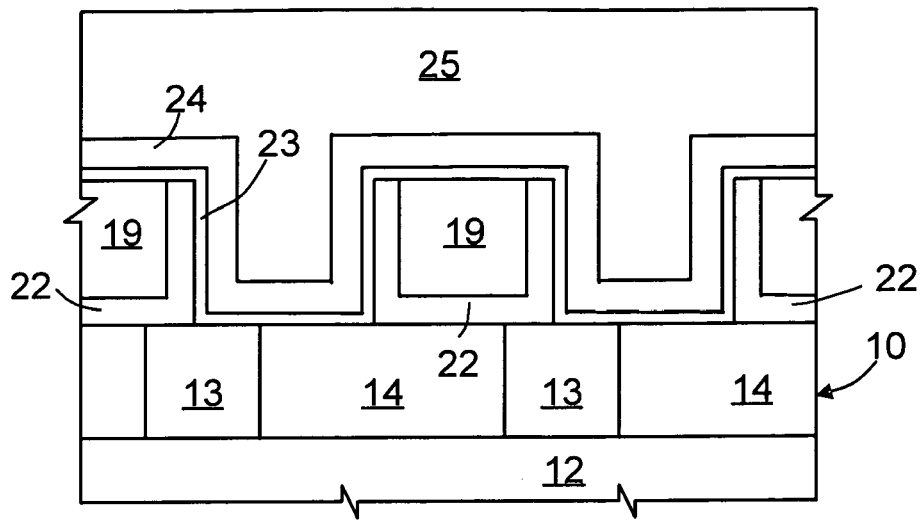

Thereafter, referring to FIG. 6, a heater layer 23 is deposited and stabilized. For example, TiSiN may be used, which conformally covers the bottom and the sides of the openings 20. Subsequently, a sheath layer 24, e.g. of silicon nitride, and a second oxide layer 25 are deposited. The second oxide layer 25 may be deposited by Sub Atmospheric Chemical Vapor Deposition Undoped Silicon Glass (USG) or High Density Plasma USG or Plasma Enhanced Chemical Vapor Deposition completely fill the openings 20 to complete the encapsulating structure in one embodiment.

Here, the sheath layer 24 and the protective region 22 isolate the heater layer 23 from the silicon oxide of the first and second oxide layers 19, 25 and prevent oxidation of the heater material.

Figure 7:
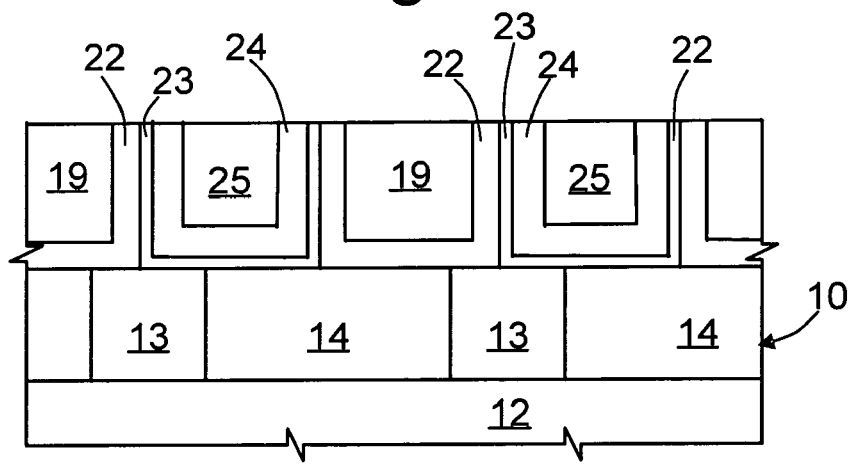

The structure is then planarized by CMP (Chemical Mechanical Polishing), thus removing all portions of the second oxide layer 25, of the sheath layer 24 and of the heater layer 23 extending outside the openings 20, as shown in FIG. 7. In particular, the remaining portions of the heater layer 23 form a plurality of heater regions 23 (one for each cell of the memory array).

Figure 8:
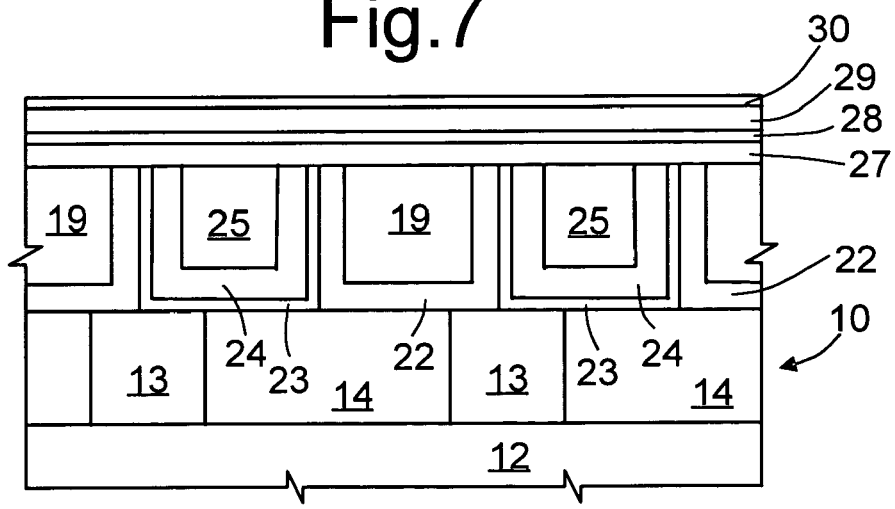
Figure 9:
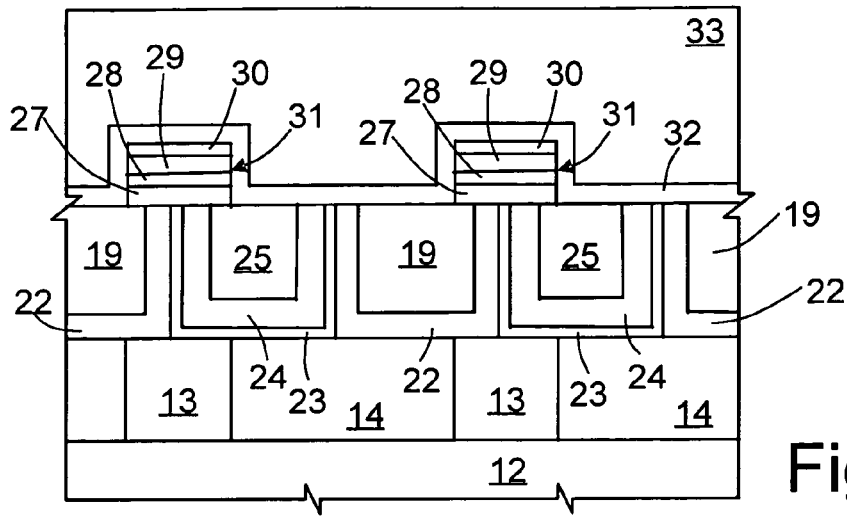

Then, referring to FIG. 8, an OMS/OTS (Ovonic Memory Switch/Ovonic Threshold Switch) stack is deposited. In detail, a first chalcogenic layer 27 (e.g., $Ge_2Sb_2Te_5$), a first barrier layer 28 (e.g., TiAlN), a second chalcogenic switch layer 29 (e.g., $As_2Se_3$) and a second barrier layer 30 (e.g., TiAlN) are deposited. The above materials are only illustrative, and any chalcogenic material or mixture of materials, including multiple layers suitable to store information depending on its physical state (for first chalcogenic layer 27) and to operate as a switch (for second chalcogenic layer 29) may be used. Moreover any barrier layer or mixture of barrier layers suitable to separate and seal chalcogenic materials may be used. The stack of layers 28-30 is then defined (FIG. 9) to form so called "dots" 31, each dot 31 comprising a storage layer 27, a first barrier layer 28, a switching layer 29, and a second barrier layer 30.

Figure 12:
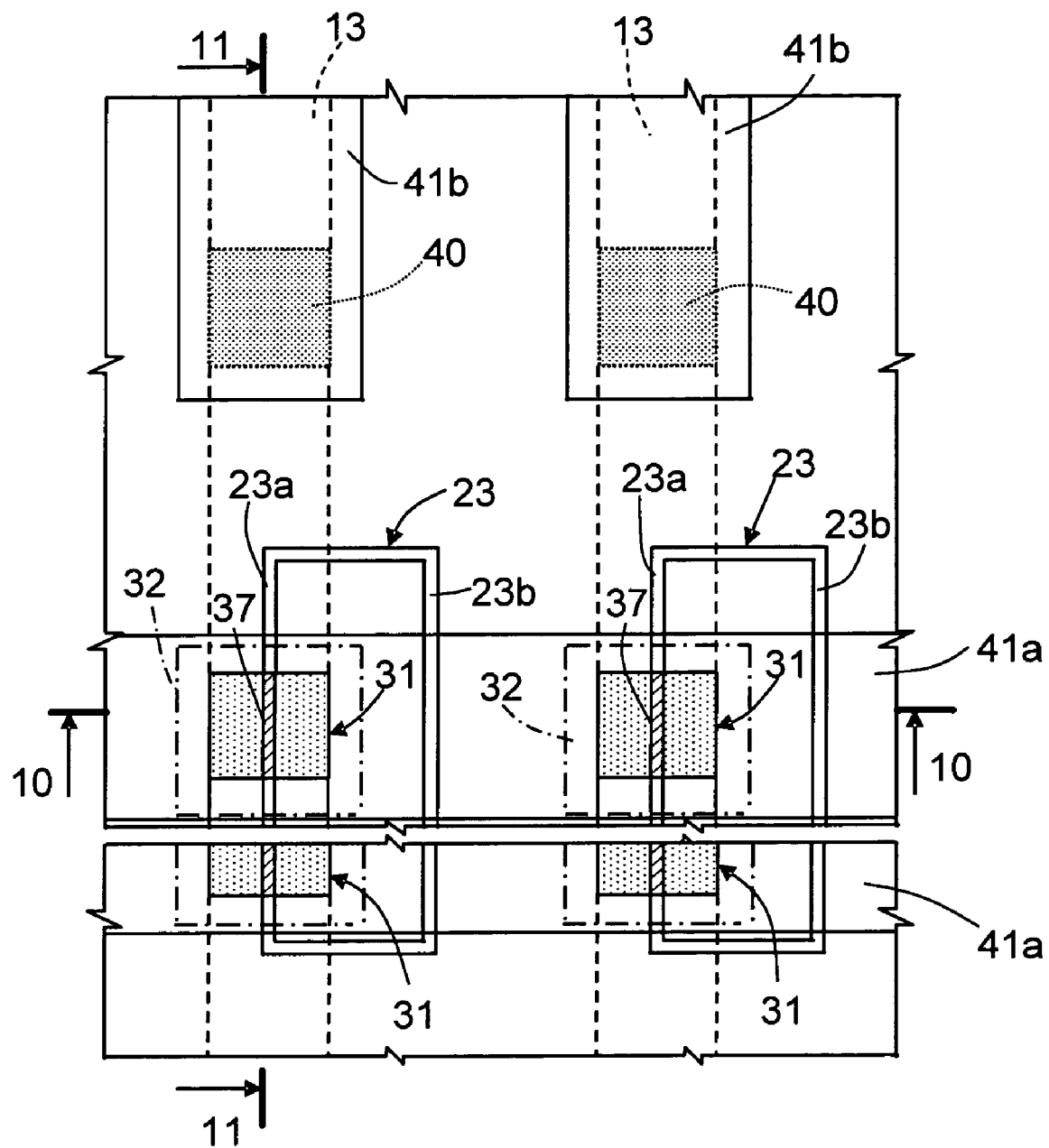
FIG. 12 is a plan view of the device of FIGS. 10 and 11.

The dots 31 extend substantially along a column of the array (see also FIG. 12).

Then a sealing layer 32, e.g., of silicon nitride, and an interlayer dielectric 33 (e.g., of silicon dioxide) are deposited.

Figure 10:
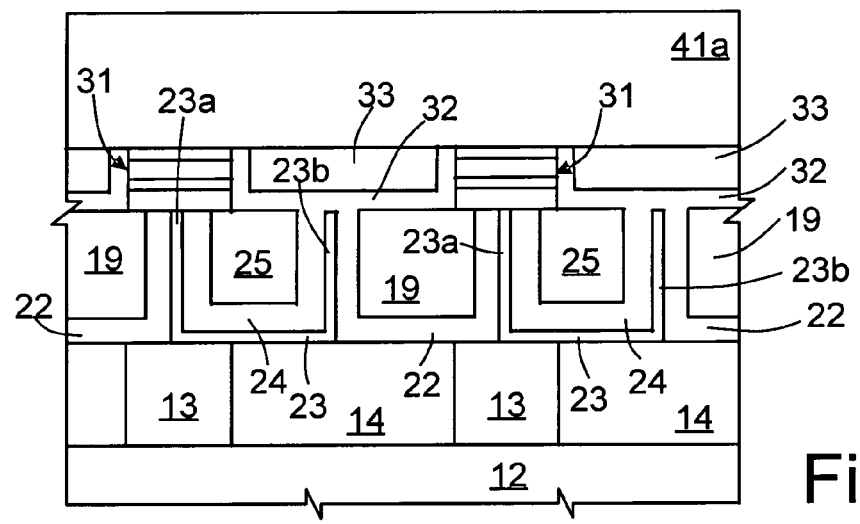
Figure 11:
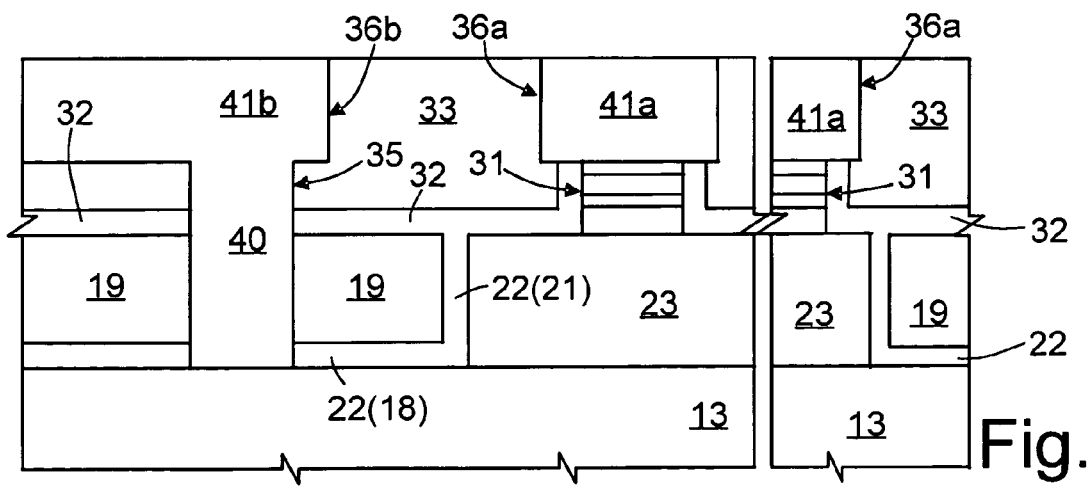
FIG. 11 is a cross-section through the device of FIG. 11, taken along line 11-11 of FIG. 12.

Finally, the wafer is subjected to CMP to planarize the structure and column lines and vias are formed, for example, using a standard dual damascene copper process. As shown in FIG. 11, the dielectric 33 and the first dielectric layer 14 (as well as the sealing layer 32 and the bottom of the protective region 22, where present) may be etched in a two-step process to form via openings 35 (extending down to the row lines 13) and trenches 36a, 36b extending down to the top of the dots 31. The two etching steps may be carried out in any sequence. Then, a metal material (e.g. Cu) is deposited that fills the vias openings 35 (FIG. 11) and the trenches 36a, 36b, forming vias 40, column lines 41a and row line connections 41b. Column lines 41a correspond to the bit lines 5 of FIG. 1. Thus the structure of FIGS. 10-12 is obtained, wherein each dot 31 is formed at the intersection between a row line 13 and a column line 41a. Obviously, connections to the underlying circuitry may be provided by this metallization level, which is not necessarily the first one.

As visible from FIGS. 10 and 12, in the final structure, each heater region 23 has a substantially box-like shape corresponding to the shape of the respective opening 20 and including a bottom region and a wall region. Specifically, each heater region 23 comprises a rectangular bottom region and four wall elements including a first and a second vertical elongated wall 23a, 23b. The first vertical elongated wall 23a (on the left, in the drawings) extends approximately above the midline of the respective row line 13 and is in electrical contact therewith. The second vertical elongated wall 23b (on the right) extends on top of the first oxide layer 19. Each first vertical elongated wall 23a forms a substantially rectangular wall-shaped heater (also called a resistive element, see FIG. 11) that contacts the respective dots 31 along a linear contact area 37 (indicated by a hatching in FIG. 12) and is shared by all the dots 31 aligned on a single row line 13. The electrical connection of all the dots 31 along a same row line 13 through the wall-shaped heater 23 does not impair the operation of the memory device, since the second chalcolgenic material 29 of the dots 31 forms an OTS or selection element allowing accessing only the dot 31 connected to both the row line 13 and the column line 41a that are addressed.

In the embodiment just described, the top portion of the protective region 22 and of the sheath layer 24, of nitride, form a glue layer for attaching the dots 31 to the underlying layers during definition of the dots 31 themselves.

The contact area 37 (FIG. 12) is rectangular, having a first dimension (in the direction of the column lines 41a) that is sublithographic and a second dimension (in the direction of the row lines 13) that is equal to the width of the dots 31. Thus, it is possible to obtain both a very reduced cell area (e.g., $4F^2-6F^2$, where F is the minimum lithographical dimension available for a given technology, and a reduced contact area 37 (t*F, where t is the thickness of the heater). In fact, the width of the heater 23 is given by the thickness of the heater layer 23 which, with the current deposition techniques, is a sublithographic dimension that is lower than a minimum dimension obtainable through optical UV lithography.

Furthermore, the decoding elements may be accommodated in the substrate below the array, resulting in a considerable saving in the occupied area.

The described structure may be repeated more times on different levels, thus allowing the formation of stacked arrays, with a further reduction in the memory bulk.

FIGS. 13-20 show a different embodiment, using a metallic/semi-metallic/semiconductor glue layer. In these embodiments, parts that are the same as in the embodiment of FIGS. 3-12 have been designated with the same reference numbers, with the following description is focused on the specific features of this embodiment.

Figure 13:
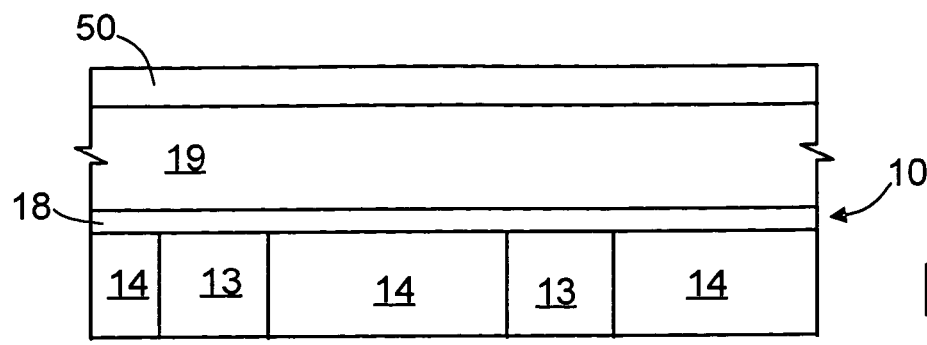
FIGS. 13-18 are cross-sections through a second embodiment of the invention, in subsequent manufacturing steps, taken generally along plane 18-18 of FIG. 12.
Figure 14:
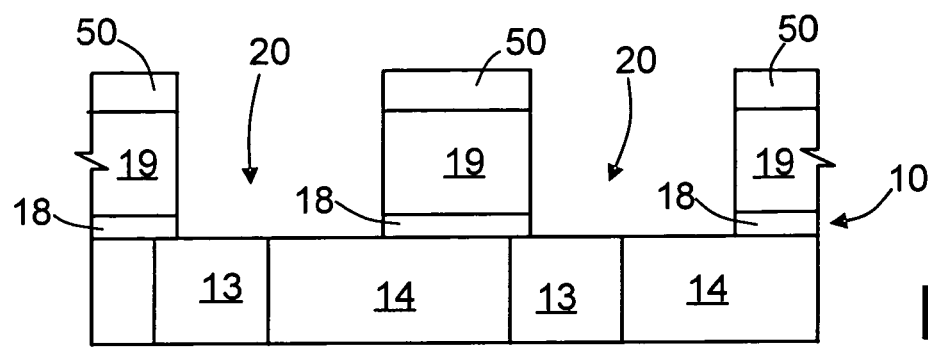

FIG. 13 shows a wafer 10 wherein row lines 13 are already formed, insulated by the first dielectric layer 14 and covered by the first nitride layer 18 and the first oxide layer 19. According to this embodiment, a glue layer 50 of metal (e.g., of Ti) is deposited on the first oxide layer 19, and thereafter, openings 20 extending through layers 50, 19, 18 are formed (FIG. 14).

Figure 15:
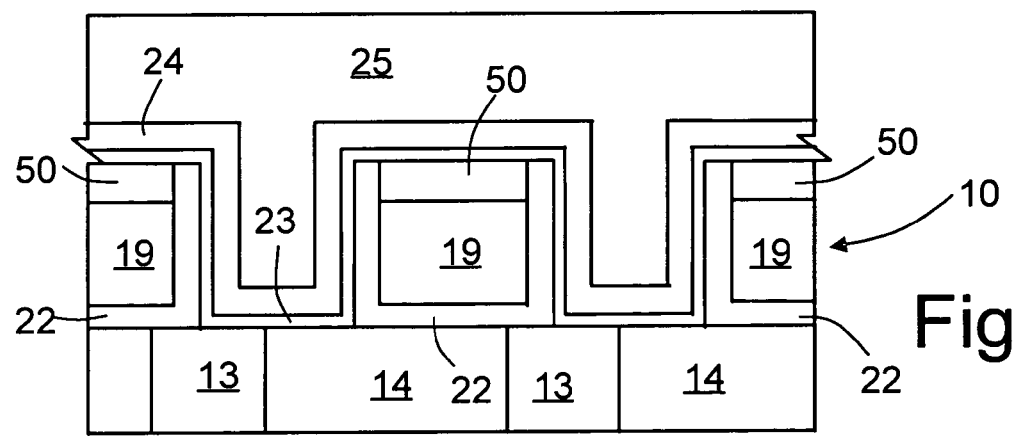

Then, in FIG. 15, a spacer layer, e.g. of silicon nitride, is deposited and etched back to form, together with the first nitride layer 18, the protective region 22. Thereafter, the heater layer 23 (e.g., of TiSiN) is deposited and stabilized, the sheath layer 24 (e.g., of silicon nitride) and a second oxide layer 25 are deposited, thus obtaining the structure of FIG. 15.

Figure 16:
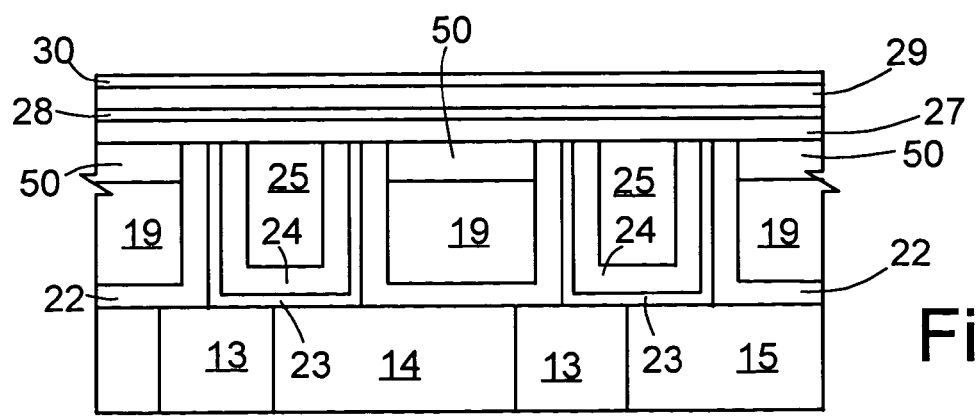
Figure 17:
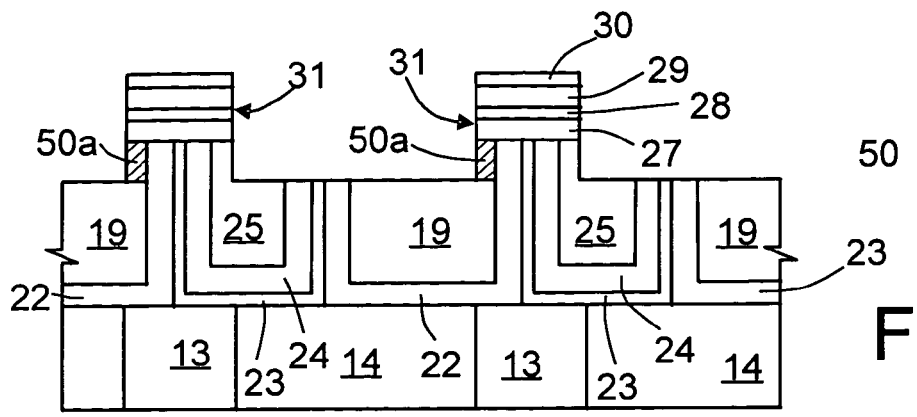

Subsequently, as indicated in FIG. 16, the structure is planarized by CMP (Chemical Mechanical Polishing), and an OMS/OTS (Ovonic Memory Switch/Ovonic Threshold Switch) stack is deposited, including first chalcogenic layer 27, first barrier layer 28, second chalcolgenic layer 29 and second barrier layer 30.

Later, the OMS/OTS stack 27-30 is defined (FIG. 17) to form the dots 31. In this case, etching is continued to etch the glue layer 50, thereby leaving only glue portions 50a under the dots 31. Etching may remove all the glue layer 50 around the dots to avoid metallic residuals that might short the dots. As a consequence, as visible in FIG. 17, on the right of each dot, the upper portions of the layers 19, 22, 23, 24, 25 are etched.

Figure 18:
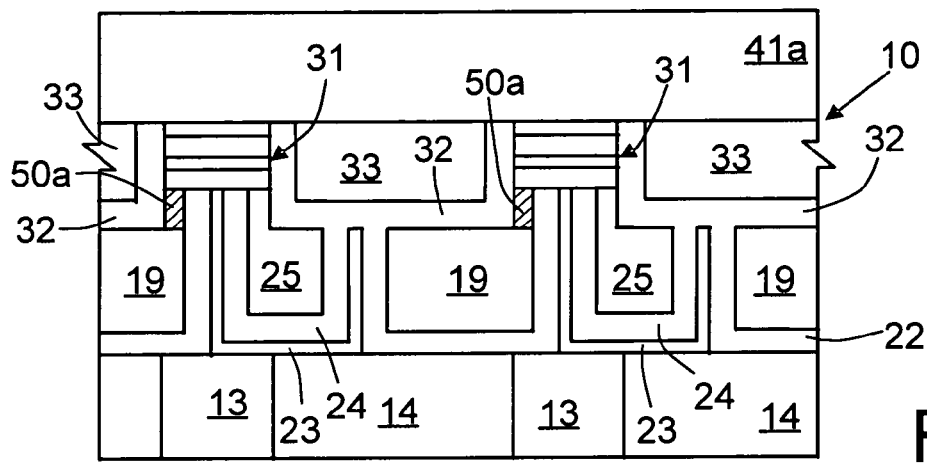
Figure 19:
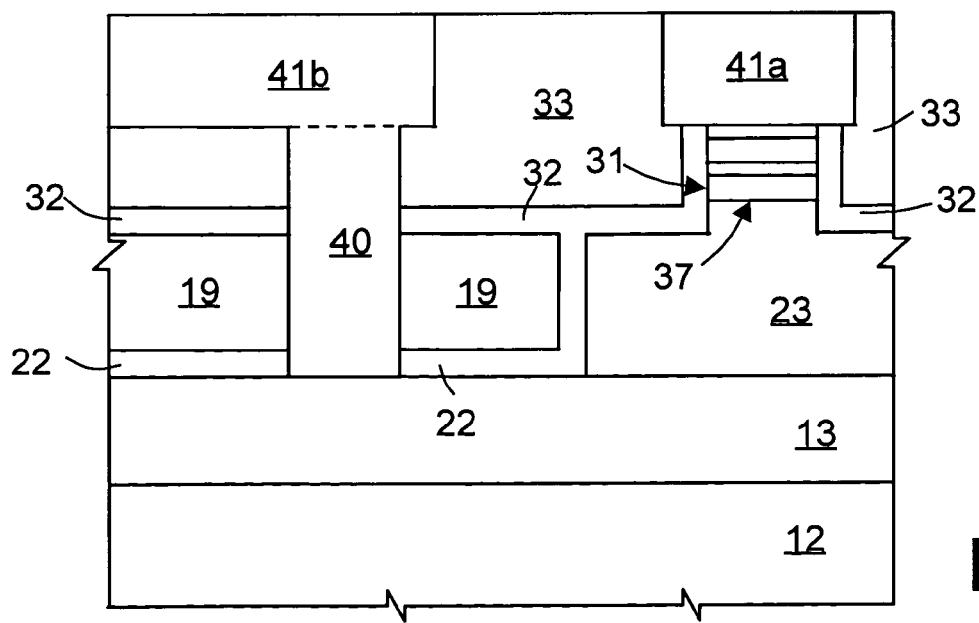
FIG. 19 is a cross-section of the device of FIG. 18, taken generally along plane 19-19 of FIG. 20.
Figure 20:
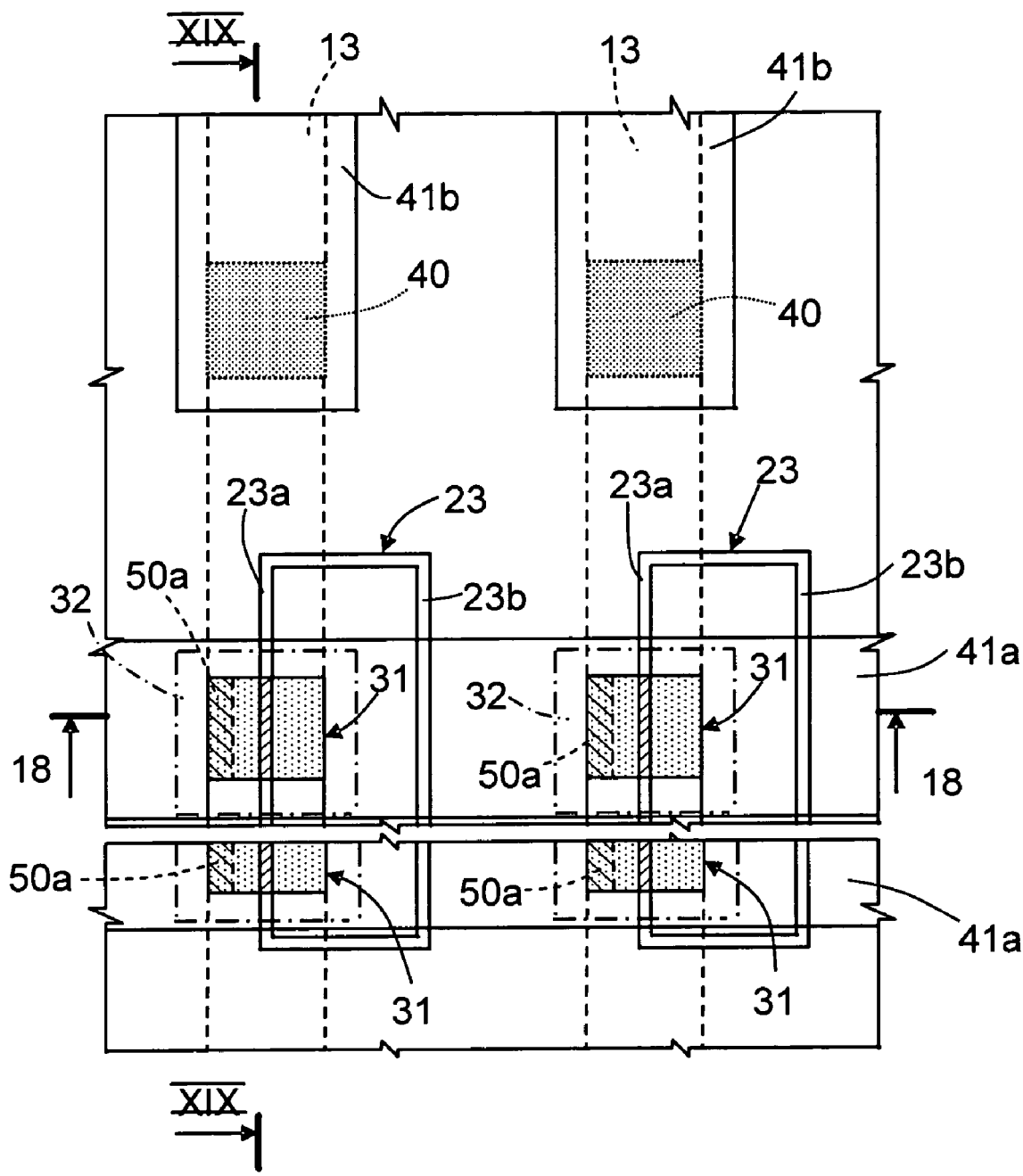
FIG. 20 is a plan view of the device of FIGS. 18 and 19.

Then, referring to FIGS. 18-20, the sealing layer 32 and the interlayer dielectric 33 are deposited. The wafer 10 is subjected to CMP. The vias 40, column lines 41a, and the row line connections 41b are formed.

With the embodiment of FIGS. 13-20, a glue region 50a of metal is formed under a portion of the dots 31. The glue region 50a is isolated from the respective heater 23, to reduce or avoid electrical shorting that could prevent the correct operation of the cell. Here, the first vertical wall 23a is substantially rectangular with at least a protruding portion defining the contact area 37 (Figure. 19).

Figure 21:
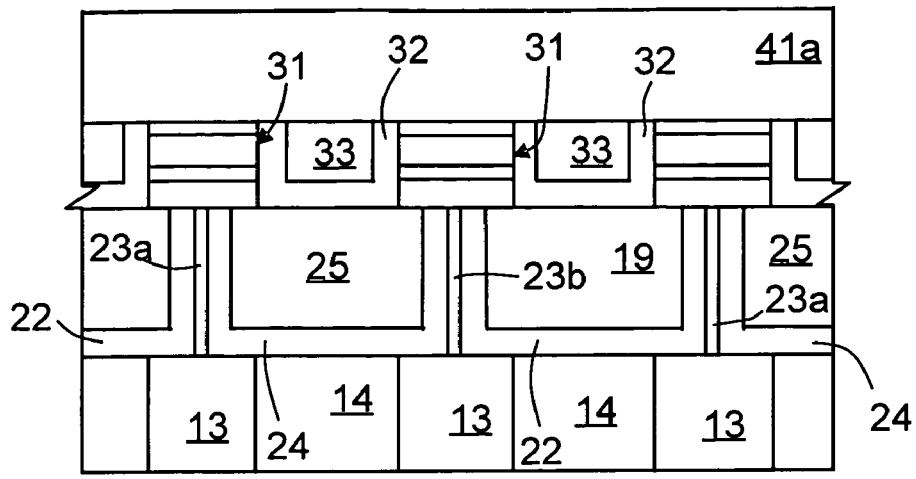
FIG. 21 is a cross-section taken along line 21-21 of FIG. 22.
Figure 22:
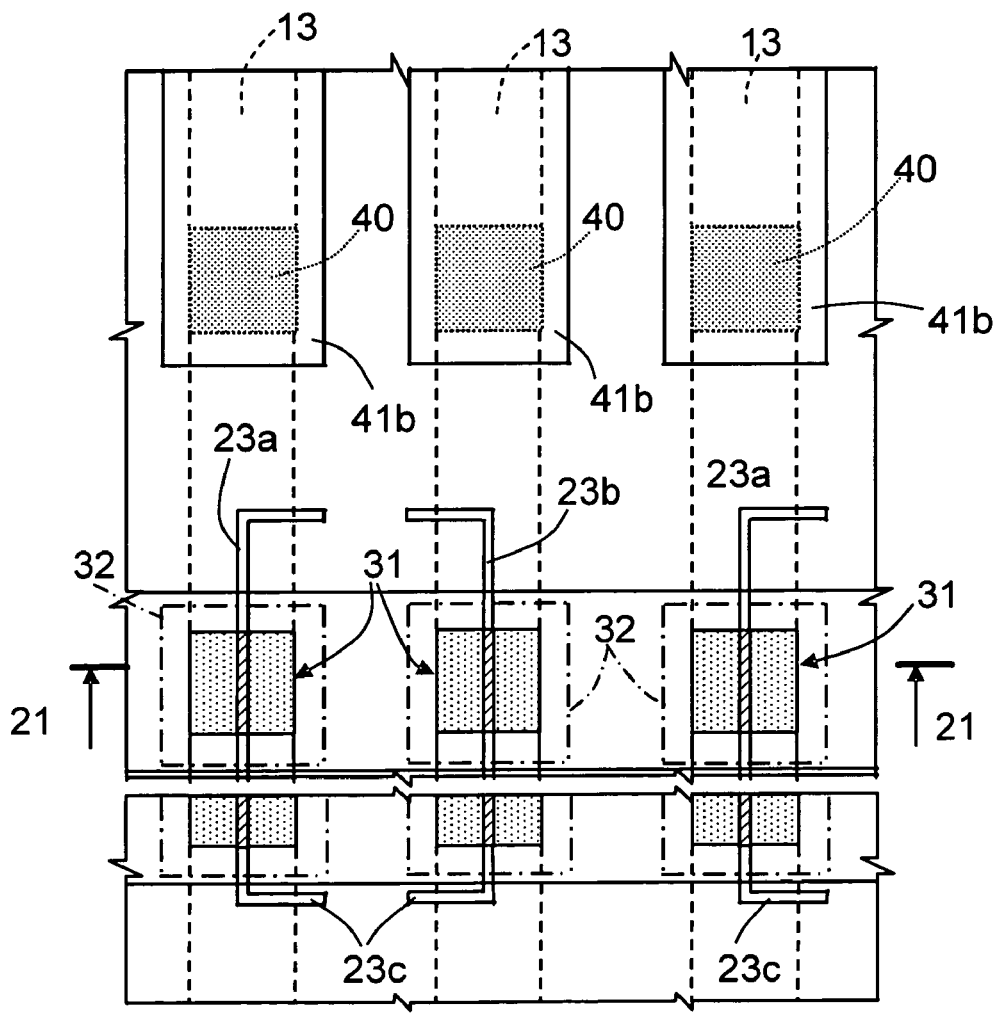
FIG. 22 is a top view of a memory device according to a third embodiment of the invention.

According to a different embodiment, the second vertical elongated wall 23b (on the right in the drawings) may be used as a distinct heater element. In this case, as visible from FIGS. 21, 22, the heater layer 23 may be removed from the bottom of the openings 20 and the first and second vertical elongated walls 23a, 23b may be electrically disconnected, in order to avoid electrical short between two adjacent row lines. To this end, as visible from the top view of FIG. 22, the vertical end walls of the heater layer 23 (indicated as 23c) are interrupted, e.g. by means of a specific etching step. As another alternative, the vertical end walls 23c may be oxidized. The final structure is shown in FIG. 21. Encapsulating the chalcogenic material with carbon may extend cycle life and stabilize operating characteristics of the chalcogenic materials such as Vth, Vhold, Ithreshold, Ileakage.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase change memory comprising:
   a U-shaped heater including a base and two spaced upstanding resistive wall elements connected to said base; and
   a planar stack including a phase change material in contact with one of said wall elements and a chalcogenic selection material over said phase change material, said stack having a common edge, said phase change material being a material that changes between amorphous and crystalline phases to store information while said chalcogenide selection material is an ovonic threshold switch that does not change phase.

2. A memory according to claim 1, including a glue region extending on one side of said wall element.

3. A memory according to claim 2, wherein glue region includes titanium.

4. A memory according to claim 1, wherein said wall element is laterally surrounded by oxidation-preventing regions.

5. A memory according to claim 1, including a stack surrounded by a sealing region.

6. A memory according to claim 1, wherein said stack comprises said storage region, a first barrier region, said selection element, and a second barrier region.

7. A memory according to claim 1, further comprising a first connection line of conductive material extending under and in electrical contact with said resistive element and a second connection line of conductive material extending on and in electrical contact with said stack extending on said wall element.

* * * * *